United States Patent
Tan et al.

(10) Patent No.: US 6,839,399 B2
(45) Date of Patent: Jan. 4, 2005

(54) PROGRAMMABLE COUNTER WITH HALF-INTEGRAL STEPS

(75) Inventors: Chun Geik Tan, Singapore (SG); Uday Dasgupta, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/403,446

(22) Filed: Mar. 31, 2003

(65) Prior Publication Data

US 2004/0190673 A1 Sep. 30, 2004

(51) Int. Cl.⁷ .................................................. H03K 21/02
(52) U.S. Cl. ........................ 377/111; 377/114; 377/116; 377/48
(58) Field of Search .................... 377/111, 114, 377/116, 48

(56) References Cited

U.S. PATENT DOCUMENTS

| | | | |
|---|---|---|---|
| 5,384,816 A | * | 1/1995 | Prysby et al. ................. 377/48 |
| 5,719,798 A | | 2/1998 | Lutz et al. ................... 364/703 |
| 5,809,290 A | | 9/1998 | DeRoo et al. ............... 395/555 |
| 6,026,140 A | | 2/2000 | Owen .......................... 377/51 |
| 6,226,295 B1 | | 5/2001 | Morzano .................... 370/395 |

* cited by examiner

Primary Examiner—Margaret R. Wambach
(74) Attorney, Agent, or Firm—George O. Saile; Stephen B. Ackerman

(57) ABSTRACT

This invention provides a circuit and a method for programmable counters. It consists of a circuit and a method for unique programmable counters that provide half-integral as well as integral steps, such as 1.5, 2, 2.5, 3, 3.5, 4. This circuit and method are the first implementations of providing programmable counting with half-integral steps. The circuit and method of this invention can be extended via the cascading of toggle flip flops at the front end of the circuit of this invention. This provides the ability to enhance the speed of normal integral step counting applications. In addition, the cascading of the multiple copies of the circuit of this invention provides the ability to provide other fractional programmable counters. A key advantage of this invention is that the method of this invention is general enough to use any other type of counter sub-component beside the binary counter sub-component of this invention.

32 Claims, 5 Drawing Sheets

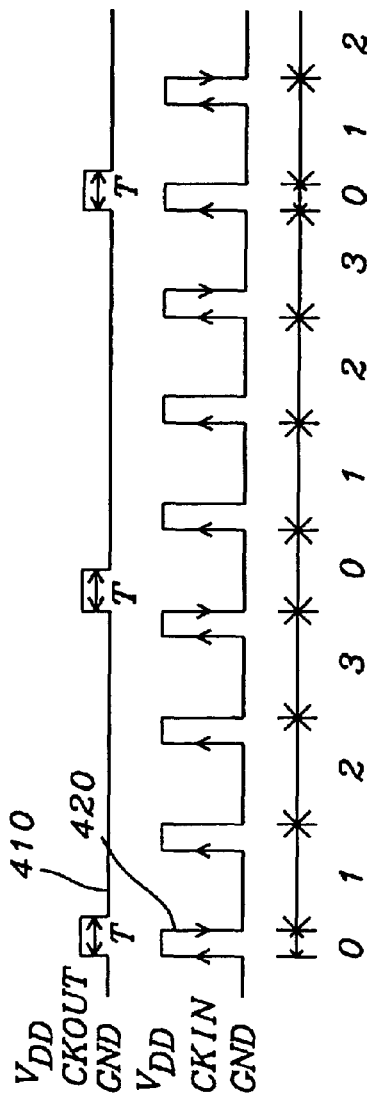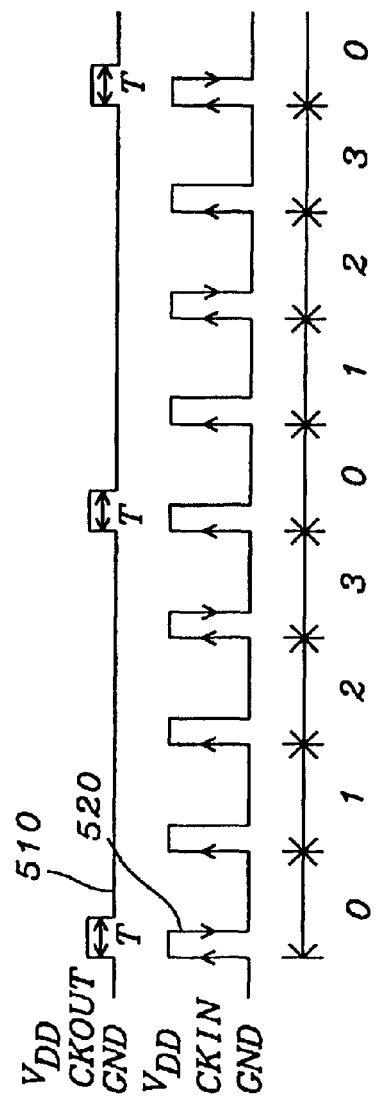

PROGRAMMABLE COUNTER WITH HALF-INTEGRAL STEPS

BACKGROUND OF THE INVENTION

1. Field of the Invention

The present invention generally relates to the general problem of designing programmable counters. More particularly, this invention relates to a circuit and a method for unique programmable counters which provide half-integral as well as integral steps.

2. Description of the Prior Art

There are plenty of counters available that divide by integers that can be programmed to change in steps of one such as by 2,3,4,5,6 and so on. Typically, programmable counters utilize a sub-component or counter such as a binary counter, a ripple counter, a modulo k counter, etc. This sub-component is surrounded by logic gates such as NANDs and exclusive-OR gates. In addition, the prior art programmable counters typically contain a digital bus or writeable/readable storage registers which provide the programmable value to be counted up to or down to. Programmable counters with integral steps are quite common in literature. However, those with half-integral steps are not described yet. Such a counter can have some very useful application that will be described later.

U.S. Pat. No. 6,226,295 (Morzano) "High Speed Programmable Counter" describes a digital counter which has a provision for starting and stopping. This allows the counter to be configurable to any integral length.

U.S. Pat. No. 6,026,140 (Owen) "Low Power Programmable Ripple Counter" describes a ripple counter which becomes programmable by use of intervening circuitry which selectively inhibits state transitions according to an initial programming step.

U.S. Pat. No. 5,809,290 (DeRoo, et al.) "Programmable Hardware Counter" describes a programmable hardware timer or counter which provides a relatively consistent measure of predetermined time intervals over a relatively wide range of performance levels.

U.S. Pat. No. 5,719,798 (Lutz, et al.) "Programmable Modulo k Counter" describes a modulo-k counter or frequency divider that produces an output pulse for every k clock pulses. The counter is programmable and synchronous, and is faster than other programmable frequency dividers.

SUMMARY OF THE INVENTION

It is therefore an object of the present invention to provide a circuit and a method for programmable counters. It is further an object of this invention to provide a circuit and a method for unique programmable counters that provide half-integral as well as integral steps, such as 1.5, 2, 2.5, 3, 3.5, 4.

The objects of this invention are achieved by a programmable counter circuit with half-integral steps. This counter circuit of this invention is made up of an N-bit binary counter, which drives an N-bit NAND circuit, a toggle flip flop, which drives an exclusive-OR gate, a mono-shot circuit, which drives a clock input of said toggle flip-flop, an exclusive-OR clock circuit, which drives the N-Bit Binary counter, an N-wide NAND gate whose output drives an input of the mono-shot, and a set of exclusive NORs, which are driven by an external digital data bus and by N true outputs from said N-bit binary counter. In addition, this programmable counter circuit with half-integral steps has a clock input, which provides input pulses, which are to be counted. This counter circuit also has a digital input bus, which is combined with said binary counter outputs in the exclusive-NOR circuits. This digital input bus specifies the number of input clock pulses to count. This counter circuit also has a single digital input, which feeds a clear input of the toggle flip-flop circuit. The counter circuit of this invention also has a clock output signal, which is a signal, which results from a programmable number of input clock pulses to be counted. The programmable counter circuit has a sub-component called an N-bit binary counter has a clock input, a reset input and N counter outputs. The toggle flip-flop has a clock input, a clear input, and a true toggle flip-flop output. The mono-shot circuit has a trigger input and a true output. The exclusive-OR clock circuit combines a primary input clock signal with the true output from the toggle flip-flop circuit to produce an internal clock, which drives the binary counter clock input. The N-wide NAND gate collects N outputs from a bank of N exclusive NOR circuits as N inputs to the NAND gate. The N-wide NAND gate's output drives said trigger to the mono-shot circuit.

The N-wide NAND gate's output drives a negative reset input to the N-bit binary counter. The N exclusive-NOR gates combine the N digital inputs with the N true outputs from the binary counter sub-component. The N digital primary inputs form a decimal value by which the binary counter divides. The single primary input, which drives the clear input of the toggle flip-flop, determines that the counter divisor is the same as the above mentioned decimal value if the single primary input is high. The single primary input also determines that the counter divisor is 0.5 less than the above mentioned decimal value if the single primary input is low.

The above and other objects, features and advantages of the present invention will be better understood from the following detailed description taken in conjunction with the accompanying drawings.

BRIEF DESCRIPTION OF THE DRAWINGS

FIG. 4 shows a timing diagram of the example of the invention being used to implement a divide by 3.5 counter with a non-50% duty cycle input clock.

FIG. 5 shows a timing diagram of the example of the invention being used to implement a divide by 4 counter with a non-50% duty cycle input clock.

DESCRIPTION OF THE PREFERRED EMBODIMENT

The invention describes a counter that divides by numbers that can be programmed to change in steps of one half such as by 1.5, 2, 2,5, 3, 3.5, 4, 4.5, 5, 5,5, 6, 6.5 . . . and so on.

Figure 1:
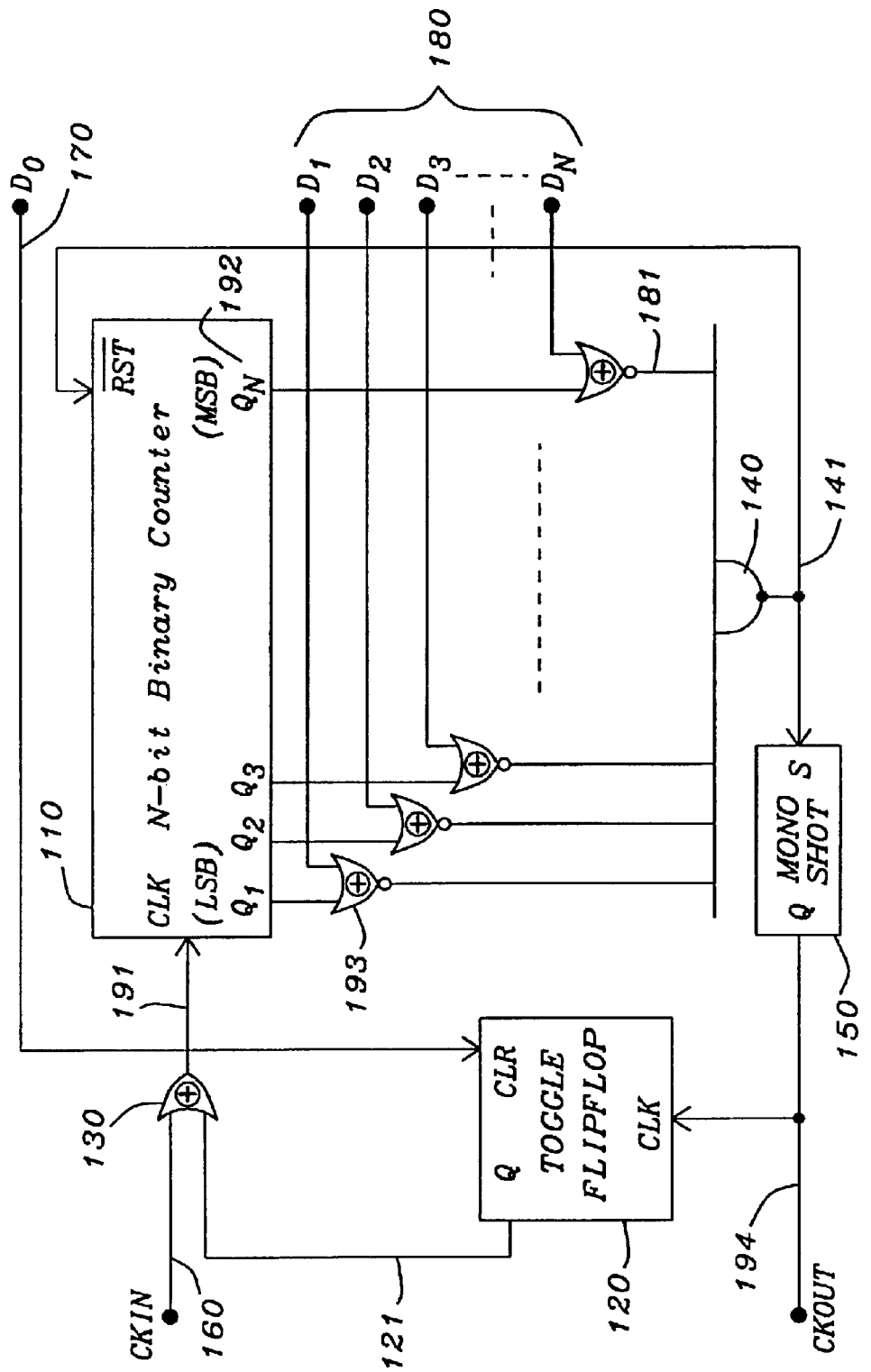
FIG. 1 shows a high-level circuit diagram of the main embodiment of this invention.

FIG. 1 shows a block diagram of the main embodiment of this invention. The input clock 160 is the signal whose clock pulses are counted by this programmable counter. This clock input 160 is exclusive-OR'D with a toggle flip-flop output 121. When the toggle flip-flop output is high, the ex-or gate inverts the clock input 160 at 191 to serve as the clock input for the N-bit binary counter. When the toggle flip-flop output is low, the ex-or gate passes the clock at 160 to the N-bit binary counter without any inversion. The digital code on the input bus 180 D1, - - - DN determines the programmable count to be counted up to. When this programmed count is reached, the output of the N-bit Binary Counter 110 is compared to the data bus D1 - - - DN 180 using exclusive NORs 193. When input bits to the exclusive NORs 193 are equal, the output 181 of the exclusive NOR is high. All of the exclusive-NOR outputs will be High when the programmed count is reached. This occurs when all of the binary counter outputs 192 equal the corresponding digital data input bus 180.

When all of the exclusive NOR outputs 181 are HIGH, the N-wide NAND gate output 141 becomes a Low-level on the 'S' input (trigger input) to the mono shot or single shot circuit 150. This low level at the input to the mono-shot circuit causes the true output, Q of the mono-shot to go high for a certain pulse width, T. This mono-shot output Q becomes the primary clock output 194 of the programmable counter of this invention. In addition, this mono-shot output, Q feeds the clock input of the toggle flip-flop circuit 120 shown in FIG. 1. The output from the N-input NAND gate is used to reset 190 the N-bit binary counter.

When the mono-shot output, Q goes HIGH, it clocks the toggle flip-flop 120. This causes the flip-flop to toggle. This means that if the toggle flip-flop output 121 was a '1', it will change or toggle to a '0'. If the toggle output 121 was a '0', it will change or toggle to a 'I'. Next, the toggle flip-flop output 121 fed into an exclusive-OR 130 circuit with the primary clock input signal 160. When the toggle flip-flop output is high, the ex-or gate inverts the clock input 160 at 191 to serve as the clock input for the N-bit binary counter. When the toggle flip-flop output is low, the ex-or gate passes the clock at 160 to the N-bit binary counter without any inversion. This output 191 of the exclusive OR circuit 130 is the clock input for the N-bit binary Counter 110. In FIG. 1, there is another primary input signal, D0 170, which feeds the clear input of the toggle flip-flop circuit 120. When the clear input of the toggle flip-flop circuit 120 goes High, the output Q 121 of the toggle flip-flop circuit 120 goes LOW.

The programmable counter of this invention shown in FIG. 1, provides a divide by M count when the D0 170 is '1' or High. The programmable counter provides a divide by M-0.5 when D0 is '0' or LOW. M equals the decimal value for the binary word formed by DN - - - D1 180, shown in FIG. 1.

A more detailed description of FIG. 1 follows. FIG. 1 shows the scheme of the invention. It consists of an N-bit binary counter with inputs CLK (clock) and RSTB (reset, active-low) and outputs $Q_N, \ldots Q_3, Q_2, Q_1$. The outputs are compared with a binary word input DN . . . D3D2D1, with the help of EXNOR gates. The outputs of the EXNOR gates are combined by an N-input NAND gate. The output of this gate is used to reset the N-bit counter. The final output of the counter CKOUT is the output of a mono-shot, which is triggered by the output of the N-input NAND gate. The input to the N-bit binary counter is obtained from the counter input CKIN after passing through an EXOR gate. The other input of the EXOR gate comes from the output of a toggle flip-flop. This flip-flop is clocked by CKOUT and is cleared (active high) by the bit input D0. All the flip-flops are assumed to be positive edge-triggered master-slave type.

The counter divides by M when D0 is 0 and by M-0.5 when D0 is 1, where M is the decimal equivalent for the binary word formed by DN . . . D3D2D1. So it can be seen that by setting M=2,3,4,5,6,7 . . . and having D0=0 and 1 for each M, it is possible to program the counter by 1.5, 2, 2,5, 3, 3.5, 4, 4.5, 5, 5,5, 6, 6.5,7 . . . and so on.

The counter counts up starting from 0 . . . 000 and when its count matches DN . . . D3D2D1, the outputs of all the EXNOR gates go high and, consequently, the N-input NAND gate goes low from a high value. This resets the counter and the outputs are brought back to 0 . . . 000. The output of this NAND gated is a narrow low-going pulse, but the width is sufficient for all the flip-flops in the counter to reset due to the relatively longer delay of the EXNOR and the N-Input NAND gates. The narrow pulse is widened to a value T with the help of the mono-shot and delivered to CLKOUT. If D0=0, the toggle flip-flop toggles and the clock to the N-bit binary counter is inverted with the help of the EXOR gate. This results in the state 0 . . . 000 to be existing for half a clock period instead of a full clock period, resulting in a division by M0.5. However, if Do=1, then the toggle flip-flop is reset and the clock to the N-bit binary counter is not inverted at all resulting in a division by M.

The waveforms for CKIN and CKOUT for different situations are given in FIGS. 2 to 5. It can be seen that the duty cycle of the CKIN does not affect the results, on the average. The arrows on the clock edges show when the N-bit binary counter gets clocked.

Figure 2:
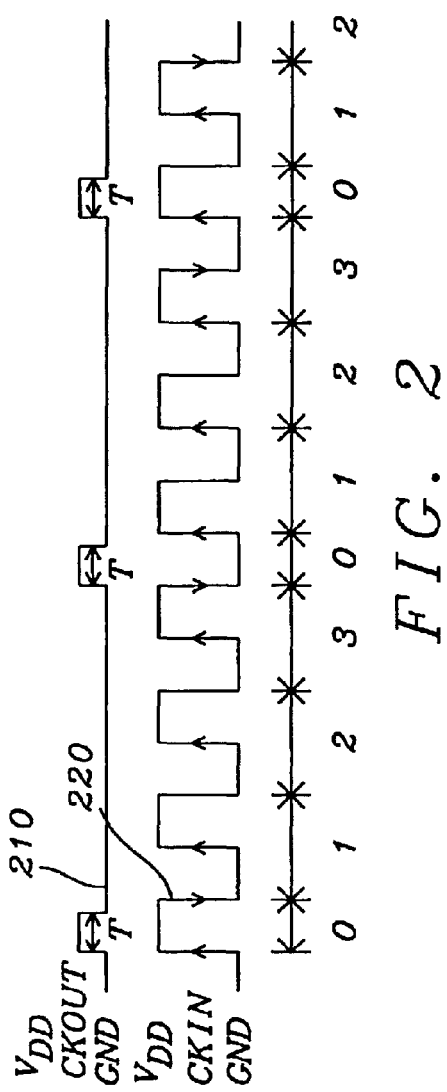
FIG. 2 shows a timing diagram of the example of the invention being used to implement a divide by 3.5 counter with a 50% duty cycle input clock.
Figure 3:
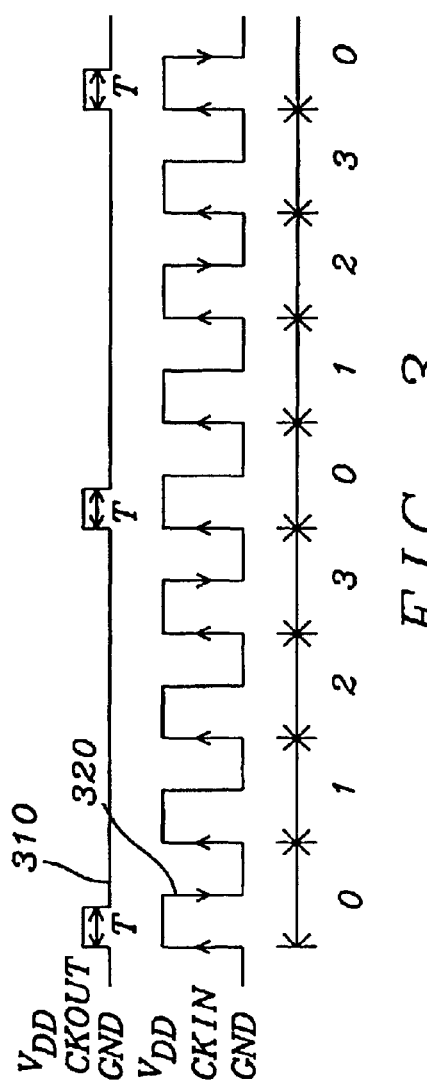
FIG. 3 shows a timing diagram of the example of the invention being used to implement a divide by 4 counter with a 50% duty cycle input clock.

FIG. 2 shows a timing diagram of a programmable count example. This example illustrates what happens when DN DN-1, D3D2D1D0=00 - - - 1010. M=101=4. Since Do=0, the counter of this invention will divide by M-0.5=3.5 as shown in FIG. 2. FIG. 2 shows the input clock, CKIN 220. Below the CKIN waveform there are counter values show 0, 1, 2, 3, then 0 again. This shows that in this example, the programmable counter counts up to 3 then resets to zero. Also, shown in this FIG. 2 is the final output clock, CKOUT 210. The width or period of the up-level of CKOUT is labeled T. Recall this period T is controlled by the mono shot circuitry. This is further explained in FIG. 6 below. In FIG. 2, notice that the zero. count is only active for one-half of a CKIN period due to the inversion of the clock input to the N-bit counter by the ex-or gate.

Figure 6A:
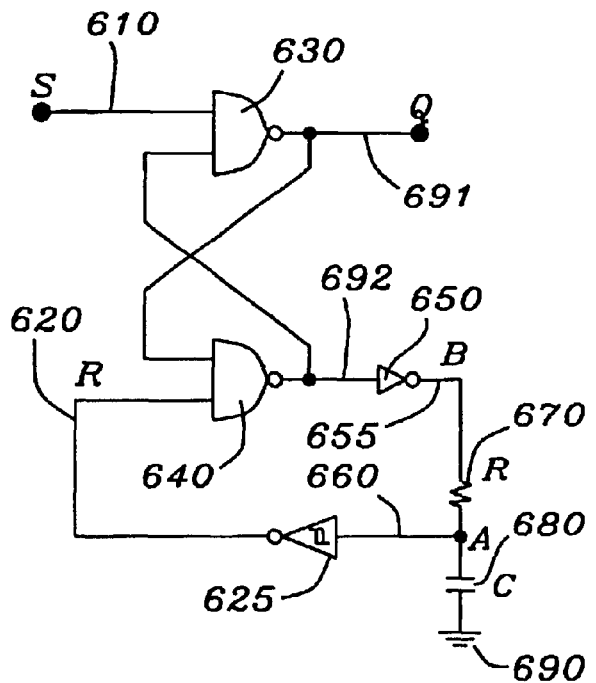
FIG. 6a shows a circuit diagram of the mono-shot circuit of this invention.

The implementation of the mono-shot is shown in FIG. 6a,b with waveforms at various points. It consists of a SR latch (with two NAND gates), a RC timing network, an inverter and an inverting Schmitt trigger. As a narrow low-going pulse at S sets the latch output Q high, the inverter duplicates the activity at B and the capacitor C charges up, for a time T, to the upper trip-point VH of the Schmitt trigger, At this point the low-going Schmitt trigger output resets the latch output Q to low through R. Now the capacitor discharges down and the Schmitt trigger output returns to high after some time as the capacitor voltage reaches VL, the lower trip-point of the Schmitt trigger. Now the mono-shot is ready for the next pulse at S. An expression for T is given by:

$$T = R_1 C_1 \ln[Vdd/(Vdd-VH)]$$

Where Vdd is the power supply voltage and VH is the upper trip point of the Schmitt trigger.

Two possible applications of the proposed counter are shown in FIG. 7. When dividing a very high frequency clock by integral steps for frequency synthesis, it is desirable to use a toggle flip-flop (divide by 2) as the first stage as it is the fastest possible divider. In the application (a) we see that it is possible to provide an overall division by 2, 3, 4, 5, 6, 7 and so on. However, if a normal programmable counter as described in the Prior Art was used, we would get a overall division by 4, 6, 8, 10, 12 and so on. So the application allows for more resolution in division; while catering for the high speed of the input clock. It will be apparent that this application can be further enhanced using several stages of toggle flip-flops in the front and one proposed counter corresponding to each toggle flip-flop at the end.

Figure 7A:
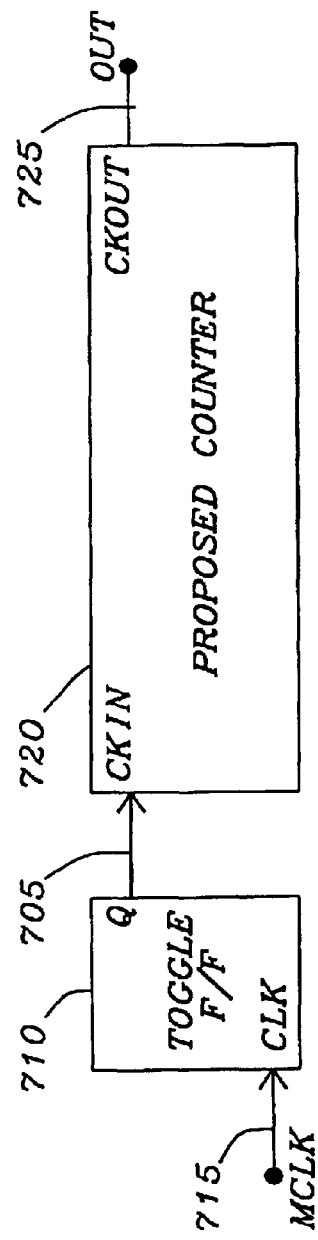
FIG. 7a shows an application of this invention which connects in series an external toggle flip flop and the circuit of this invention.
Figure 7B:
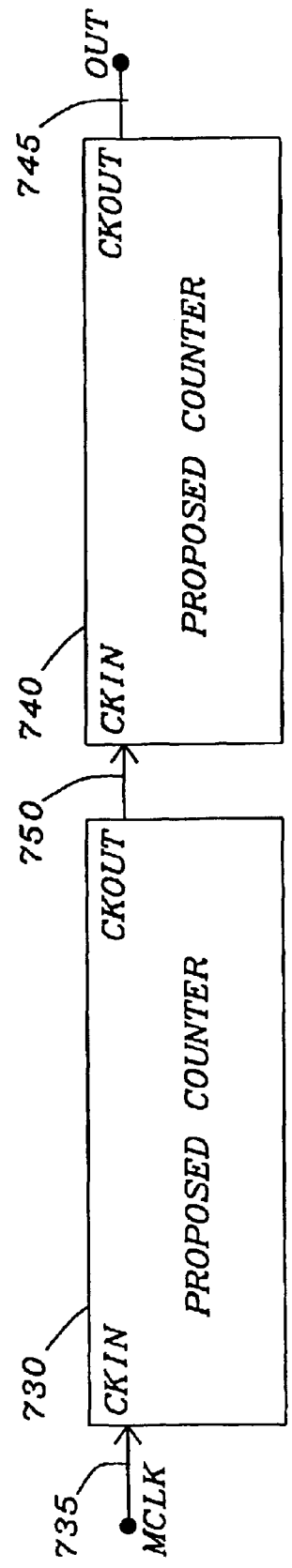
FIG. 7b shows an application of this invention which connects in series two circuits of this invention.

The application in FIG. 7b shows that we can get division by various mixed fractional numbers cascading two of the proposed counters. For example, if M is an integer, it is possible to get division by the following equation $$(M\pm 0.5)(M\pm 0.5)=M^2\pm M+0.25$$

This is achieved by cascading two identical divide by M±0.5 stages. Therefore, it is possible to get division by integers with fractional extensions. Other fractions can be obtained by having more stages and/or different values of M for each stage. The method of this invention is general enough to use any other type of counter than the binary counter mentioned above and shown in FIG. 1.

FIG. 6a shows details of the mono shot circuit. It is made up of two 2-input NAND gates 630, 640. The output of the first NAND gate 630 is fedback into one of the two inputs to the second NAND gate. Similarly, the output of the second NAND gate 640 is fedback into the one of the two inputs of the first NAND gate. The other input of the first NAND gate is the SET, S input 610.

The second input to the second NAND gate is the Reset, R input 620. This reset signal 620 comes from the output of an inverter with hysteresis 625. The input 660 to this inverter 625 comes from a resistor 670/capacitor 680 divider. One node of the capacitor $C_1$ 680 is attached to the inverter 625 input 660. The other node of the capacitor, $C_1$ is attached to ground 690. One node of the resistor, $R_1$ is attached to the inverter 625 input 660. The other node of the resistor, $R_1$ is attached to a second inverters 650 output 655. The input of the second inverter 692 comes from the output of the second NAND circuit 640.

Figure 6B:
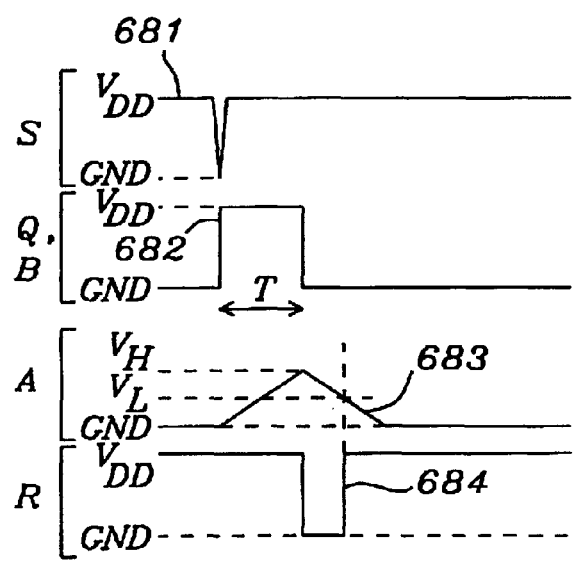
FIG. 6b shows a timing diagram which describes the operation of the mono-shot circuit of this invention.

FIG. 6b shows a timing diagram, which explains the operation of the mono shot of this invention. The set, S signal 681 goes low in a spike signal. This causes the output Q 691 of the first 2 input NAND 630 to go HIGH for a period, T. This also caused the output, B of the second inverter 650 to go HIGH for a period, T. This pulse B of T duration drives into the RC network 670, 680 of FIG. 6a. The resultant waveform at node A is shown in FIG. 6b. Also, the voltage at the reset input R 620 is shown as a negative pulse 684 in FIG. 6b.

FIGS. 7a & 7b shows two applications of the counter of this invention. FIG. 7a shows a toggle flip-flop receiving the CKIN or master clock, MCLK 715. The output of this toggle flip-flop 710 drives the counter 720 of this invention to produce the output clock 725.

FIG. 7b shows the master clock, MCLK 735 driving one counter 730 of this invention. The output of this counter 750 drives the input of a second counter 740 of the type of this invention. The output 745 of this second counter 740 is the output of this application.

The advantages of this invention are several. The circuit and method of this invention are the first implementations of providing programmable counting with half-integral steps. In addition, the circuit and method of this invention can be extended via the cascading demonstrated in FIGS. 7a,b. The cascading of toggle flip flops at the front end of the circuit of this invention in FIG. 7a provides the ability to enhanced the speed of normal integral step counting applications. In addition, the cascading of the circuits of this invention as shown in FIG. 7b provides the ability to provide other fractional programmable counters. In addition, a very key advantage of this invention is that the method of this invention is general enough to use any other type of counter sub-component in FIG. 1 beside the binary counter shown.

While the invention has been described in terms of the preferred embodiments, those skilled in the art will recognize that various changes in form and details may be made without departing from the spirit and scope of the invention.

What is claimed is:

1. A programmable counter circuit with half-integral steps comprising:

an N-bit binary counter, which drives an N-bit NAND circuit, a toggle flip flop, which drives an exclusive-OR gate, a mono-shot circuit, which drives a clock input of said toggle flip-flop, an exclusive-OR clock circuit, which drives said N-Bit Binary counter, an N-wide NAND gate whose output drives an input of said mono-shot, and a set of N exclusive NOR gates, which are driven by N digital inputs and by N true outputs from said N-bit binary counter.

2. The programmable counter circuit with half-integral steps of claim 1 further comprising:

a clock input, which provides input pulses, which are to be counted.

3. The programmable counter circuit with half-integral steps of claim 2 wherein said N digital inputs digital input bus specifies a number of said input pulses from said clock input to count.

4. The programmable counter circuit with half-integral steps of claim 1 further comprising:

a single digital input, which feeds a clear input of said toggle flip-flop circuit.

5. The programmable counter circuit with half-integral steps of claim 1 further comprising:

a clock output signal, which is a signal, which results from a programmable number of input clock pulses to be counted.

6. The programmable counter circuit with half-integral steps of claim 2 wherein said N-bit binary counter has a reset input and N counter outputs.

7. The programmable counter circuit with half-integral steps of claim 1 wherein said toggle flip-flop has a clear input, and a true toggle flip-flop output.

8. The programmable counter circuit with half-integral steps of claim 2 wherein said mono-shot circuit has a trigger input and a true output.

9. The programmable counter circuit with half-integral steps of claim 7 wherein said exclusive-OR clock circuit combines a primary input clock signal with said true output from said toggle flip-flop circuit to produce an internal clock, which drives said clock input.

10. The programmable counter circuit with half-integral steps of claim 1 wherein said N-wide NAND gate collects N outputs from a bank of said N exclusive NOR gates as N inputs to said NAND gate.

11. The programmable counter circuit with half-integral steps of claim 8 wherein said N-wide NAND gate's output drives said trigger input to said mono-shot circuit.

12. The programmable counter circuit with half-integral steps of claim 1 wherein said N-wide NAND gate's output drives a negative reset input to said N-bit binary counter.

13. The programmable counter circuit with half-integral steps of claim 1 wherein said N-exclusive-NOR gates combine said N-digital inputs with N-true outputs from said binary counter.

14. The programmable counter circuit with half-integral steps of claim 4 wherein said N digital inputs form a counter divisor, which is a decimal value by which said binary counter divides.

15. The programmable counter circuit with half-integral steps of claim 14 wherein said single digital input, which drives said clear input of said toggle flip-flop, determines that said counter divisor is 0.5 less of said decimal value if said single digital input is zero.

16. The programmable counter circuit with half-integral steps of claim 14 wherein said single digital input, which drives said clear input of said toggle flip-flop, determines that said counter divisor is not 0.5 less of said decimal value if said single digital input is one.

17. A programmable method of counting with half-integral steps comprising the steps of:
   providing an N-bit binary counter, which drives an N-bit NAND circuit,
   providing a toggle flip flop, which drives an exclusive-OR gate,
   providing a mono-shot circuit, which drives a clock input of said toggle flip-flop,
   providing an exclusive-OR clock circuit, which drives said N-bit binary counter,
   providing an N-wide NAND gate whose output drives an input of said mono-shot, and
   providing a set of N exclusive NOR gates, which are driven by N digital inputs and by N true outputs from said N-bit binary counter.

18. The programmable method of counting with half-integral steps of claim 17 further comprising the steps of:
   providing a clock input, which provides input pulses, which are to be counted.

19. The programmable method of counting with half-integral steps of claim 18 wherein said N digital inputs specifies a number of said input pulses from said clock input to count.

20. The programmable method of counting with half-integral steps of claim 17 further comprising:
   a single digital input, which feeds a clear input of said toggle flip-flop circuit.

21. The programmable method of counting with half-integral steps of claim 17 further comprising:
   a clock output signal, which is a signal, which results from a programmable number of input clock pulses to be counted.

22. The programmable method of counting with half-integral steps claim 18 wherein said N-bit binary counter has a reset input and N counter outputs.

23. The programmable method of counting with half-integral steps of claim 17 wherein said toggle flip-flop has a clear input, and a true toggle flip-flop output.

24. The programmable method of counting with half-integral steps of claim 18 wherein said mono-shot circuit has a trigger input and a true output.

25. The programmable method of counting with half-integral steps of claim 24 wherein said exclusive-OR clock circuit combines a primary input clock signal with said true output from said toggle flip-flop circuit to produce an internal clock, which drives said clock input.

26. The programmable method of counting with half-integral steps of claim 17 wherein said N-wide NAND gate collects N outputs from a bank of said N exclusive NOR gates as N inputs to said NAND gate.

27. The programmable method of counting with half-integral steps of claim 24 wherein said N-wide NAND gate's output drives said trigger input to said mono-shot circuit.

28. The programmable method of counting with half-integral steps of claim 17 wherein said N-wide NAND gate's output drives a negative reset input to said N-bit binary counter.

29. The programmable method of counting with half-integral steps of claim 17 wherein said N-exclusive-NOR gates combine said N-digital inputs with N-true outputs from said binary counter.

30. The programmable method of counting with half-integral steps of claim 20 wherein said N digital inputs form a counter divisor, which is a decimal value by which said binary counter divides.

31. The programmable method of counting with half-integral steps of claim 30 wherein said single digital input, which drives said clear input of said toggle flip-flop, determines that a counter divisor is 0.5 less of said decimal value if said single primary input is zero.

32. The programmable method of counting with half-integral steps of claim 30 wherein said single digital input, which drives said single digital input, which drives said clear input of said toggle flip-flop, determines that said counter divisor is not 0.5 less of said decimal value if said single primary input is one.

* * * * *